(12) United States Patent
Sasaki et al.

(10) Patent No.: US 8,124,507 B2
(45) Date of Patent: Feb. 28, 2012

(54) SEMICONDUCTOR DEVICE AND METHOD FOR FABRICATING THE SAME

(75) Inventors: Yuichiro Sasaki, Osaka (JP); Katsumi Okashita, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/937,169

(22) PCT Filed: Mar. 4, 2010

(86) PCT No.: PCT/JP2010/001520
§ 371 (c)(1),
(2), (4) Date: Oct. 8, 2010

(87) PCT Pub. No.: WO2010/150442
PCT Pub. Date: Dec. 29, 2010

(65) Prior Publication Data
US 2011/0147856 A1 Jun. 23, 2011

(30) Foreign Application Priority Data

Jun. 24, 2009 (JP) ................................. 2009-150002

(51) Int. Cl.
*H01L 29/78* (2006.01)
*H01L 21/223* (2006.01)
(52) U.S. Cl. .. 438/513; 438/522; 438/524; 257/E21.143
(58) Field of Classification Search .................. 438/513, 438/522, 524
See application file for complete search history.

(56) References Cited

U.S. PATENT DOCUMENTS

2005/0202618 A1 9/2005 Yagishita
2005/0280090 A1* 12/2005 Anderson et al. ............. 257/347
2007/0196973 A1* 8/2007 Park .............................. 438/197

(Continued)

FOREIGN PATENT DOCUMENTS

JP 2005-294789 10/2005

(Continued)

OTHER PUBLICATIONS

B. Mizuno et al., "Plasma Doping into the Side-Wall of a Sub-0.5μm Width Trench," Extended Abstracts of the 19th International Conference on SSDM, pp. 319-322, 1987.

(Continued)

*Primary Examiner* — Alexander Ghyka
(74) *Attorney, Agent, or Firm* — McDermott Will & Emery LLP

(57) ABSTRACT

A fin-type semiconductor region (103) is formed on a substrate (101), and then a resist pattern (105) is formed on the substrate (101). An impurity is implanted into the fin-type semiconductor region (103) by a plasma doping process using the resist pattern (105) as a mask, and then at least a side of the fin-type semiconductor region (103) is covered with a protective film (107). Thereafter, the resist pattern (105) is removed by cleaning using a chemical solution, and then the impurity implanted into the fin-type semiconductor region (103) is activated by heat treatment.

9 Claims, 12 Drawing Sheets

U.S. PATENT DOCUMENTS

| | | | |
|---|---|---|---|
| 2008/0050897 A1* | 2/2008 | Kottantharayil | 438/513 |
| 2008/0179683 A1 | 7/2008 | Sasaki et al. | |
| 2009/0020786 A1* | 1/2009 | Lenoble et al. | 257/213 |
| 2009/0026540 A1 | 1/2009 | Sasaki et al. | |
| 2010/0041198 A1* | 2/2010 | Zhu et al. | 438/283 |
| 2010/0200923 A1* | 8/2010 | Chen et al. | 257/365 |
| 2010/0270619 A1* | 10/2010 | Lee | 257/365 |
| 2011/0151652 A1* | 6/2011 | Sssaki et al. | 438/513 |
| 2011/0272763 A1* | 11/2011 | Sasaki et al. | 257/347 |
| 2011/0275201 A1* | 11/2011 | Sasaki et al. | 438/513 |

FOREIGN PATENT DOCUMENTS

| | | |
|---|---|---|
| WO | WO 2008/090771 A1 | 7/2008 |
| WO | WO 2009/016778 A1 | 2/2009 |

OTHER PUBLICATIONS

D. Lenoble et al., "Evaluation of Plasma Doping for sub-0.18 μm Devices," 1998 Int. Conf. Ion Implantation Technology Proc., pp. 1222-1225, 1999.

* cited by examiner (a)

(b)

(c)

SEMICONDUCTOR DEVICE AND METHOD FOR FABRICATING THE SAME

RELATED APPLICATIONS

This application is the U.S. National Phase under 35 U.S.C. §371 of International Application No. PCT/JP2010/001520, filed on Mar. 4, 2010, which in turn claims the benefit of Japanese Application No. 2009-150002, filed on Jun. 24, 2009, the disclosures of which Applications are incorporated by reference herein.

TECHNICAL FIELD

The present invention relates to semiconductor devices and methods for fabricating the same, and more particularly relates to a semiconductor device including a fin-type semiconductor region into which impurities are implanted by plasma doping, and a method for fabricating the same.

BACKGROUND ART

Planar-type and fin-type semiconductor devices have been studied in order to miniaturize semiconductor devices each including a substrate, such as a silicon substrate. Such semiconductor devices mostly utilize reduction of the short channel effect by using source/drain extension regions (hereinafter simply referred to as extension regions). In order to reduce the short channel effect, shallow extension regions need to be formed, and the extension regions need to be heavily doped with an impurity. For this reason, a technique called plasma doping in which silicon, etc., is doped with an impurity by using plasma started to be developed in the late 1980s (see NON-PATENT DOCUMENT 1). Research and development have been directed at forming shallow extension regions of high impurity concentration using plasma doping since the late 1990s (see NON-PATENT DOCUMENTS 2 and 3).

CITATION LIST

Non-Patent Document

NON-PATENT DOCUMENT 1: B. Mizuno, et al., "Plasma Doping into the Side-Wall of a Sub-0.5 µm Width Trench," Ext. Abs. of International Conference on SSDM, p. 317 (1987).

NON-PATENT DOCUMENT 2: D. Lenoble, et al., "Evaluation of Plasma Doping for Sub-0.18 µm Devices," 1998 Int. Conf. Ion Implantation Technology Proc., p. 1222 (1999).

SUMMARY OF THE INVENTION

Technical Problem

However, the conventional semiconductor device fabrication method described in NON-PATENT DOCUMENTS 1, 2, etc., has the following problem: a fin-type semiconductor device (a semiconductor device including a fin-type semiconductor region on a substrate), such as a fin-type field effect transistor (FET), cannot provide desired transistor characteristics, such as the on-state current.

In view of the above, it is an object of the present invention to allow a fin-type semiconductor device including an impurity-implanted layer formed by plasma doping to provide desired characteristics.

Solution to the Problem

In order to achieve the above object, the present inventors had investigated the reason why desired characteristics of a fin-type semiconductor device cannot be obtained by a semiconductor device fabrication method including the formation of extension regions using a conventional plasma doping process, and thus, found the following facts.

FIG. 12 is a diagram illustrating the result obtained after the present inventors investigated the relationship between the amount of impurities implanted by plasma doping and the loss of the impurities in a subsequent cleaning process step. The graph (a) in FIG. 12 illustrates the profile of boron concentration in the depth direction after an extremely shallow region in a planar-type semiconductor region is doped with boron serving as an impurity by using a conventional plasma doping process; the graph (b) in FIG. 12 is the profile of boron concentration in the depth direction after cleaning for removal of a resist is performed subsequent to the extremely shallow doping of the planar-type semiconductor region with boron serving as an impurity using the conventional plasma doping process; and the graph (c) in FIG. 12 illustrates the profile of boron concentration in the depth direction after cleaning for removal of a resist is performed subsequent to the extremely shallow doping of a planar-type semiconductor region with boron serving as an impurity using a conventional $BF_2$ ion implantation process. Sulfuric acid hydrogen peroxide mixture (SPM) and ammonia hydrogen peroxide mixture (APM) are used for cleaning.

As illustrated in the graph (a) in FIG. 12, the boron concentration in the outermost surface of the semiconductor region is extremely high immediately after plasma doping. Here, the dose of the implanted boron is relatively high, such as $2.3 \times 10^{15}$ cm$^{-2}$. However, as illustrated in the graph (b) in FIG. 12, when cleaning for removal of a resist has been performed after the plasma doping, the boron concentration in the outermost surface is lower than that in the graph (a). This corresponds to a reduction in the dose of the implanted boron to $1.3 \times 10^{15}$ cm$^{-2}$. Specifically, when cleaning for removal of a resist has been performed, approximately 43% of the boron implanted by plasma doping is removed together with the resist.

By contrast, as seen by comparing the graph (b) in FIG. 12 with the graph (c) therein, when the boron implantation is performed by plasma doping, the boron concentration in the outermost surface can be kept higher than when the boron implantation is performed by ion implantation even after the cleaning for removal of a resist. Specifically, plasma doping has the advantage over ion implantation because plasma doping enables shallow implantation of a high concentration of impurities, i.e., boron.

However, as described above, as is clear from the comparison between the graph (a) in FIG. 12 and the graph (b) therein, the impurities implanted at a high concentration by plasma doping are significantly removed in the cleaning process step. As such, since the impurities which should originally contribute to a resistance reduction achieved by activation annealing are lost in the cleaning process step, the potential performance of plasma doping cannot be realized.

In the example illustrated in FIG. 12, a planar-type semiconductor region is used. However, when a fin-type semiconductor region is used, the amount of impurities which are merely adhered to the side surfaces of the fin-type semiconductor region among the outer surfaces thereof is greater than that of impurities which are adhered to the surface of the planar-type semiconductor region, and thus, the amount of the impurities removed in the cleaning process step is greater than when a planar-type semiconductor region is used. Therefore, the use of a conventional fabrication method for a fin-type semiconductor device makes it more difficult to realize the potential performance of plasma doping than when a conventional fabrication method for a planar-type semiconductor device is used.

Since, as described above, according to a conventional fin-type semiconductor device fabrication method including the formation of extension regions using a conventional plasma doping process, approximately half of the amount of the impurities implanted by plasma doping is removed in a cleaning process step, the resistance of the extension regions cannot be sufficiently reduced. When a fin-type semiconductor device including such extension regions is operated, this reduces the amount of current passing through the extension regions, thereby making it impossible to obtain desired transistor characteristics which should be originally obtained.

Based on the above finding, the present inventors recognized that a fin-type semiconductor device including ultra-shallow extension regions providing low resistance can be obtained by reducing the loss of impurities adhered to or implanted into a fin-type semiconductor region by plasma doping in cleaning. Here, when, in a fin-type semiconductor device, e.g., a fin-type FET, attention is directed toward the side surfaces of a fin-type semiconductor region, the amount of impurities adhered to the surface of semiconductor by plasma doping is greater than that of impurities implanted into semiconductor by plasma doping. Furthermore, in a fin-type FET, etc., side portions of a fin-type semiconductor region serve as main paths through which the on-state current of the semiconductor device passes, and thus, it is very significant to reduce the loss of impurities adhered to the side surfaces of the fin-type semiconductor region in a cleaning process step.

Therefore, the present inventors arrived at the invention in which impurities are adhered to or implanted into the side surfaces, etc., of a fin-type semiconductor region by plasma doping, and then a protective film is formed to cover at least the side surfaces of the fin-type semiconductor region before cleaning, thereby reducing the removal of the impurities, e.g., adhered to the side surfaces of the fin-type semiconductor region by plasma doping during cleaning.

FIG. 1 is a flow chart illustrating a specific example of a method for fabricating a fin-type semiconductor device according to the present invention.

Specifically, as illustrated in FIG. 1, a resist pattern is first formed to have an opening on a region of the surface of a substrate into which impurities of a desired conductivity type are to be implanted, and then a shallow portion of a fin-type semiconductor region located under the opening of the resist pattern is doped with impurities by plasma doping to form an impurity-implanted layer (extension region). Here, a gate electrode is previously formed astride the fin-type semiconductor region. Next, a thin protective film is formed on the impurity-implanted layer to reduce the loss of the impurities in a cleaning process step for removal of the resist.

Here, the protective film is preferably formed under the conditions that the protective film tends to be formed on surfaces vertical to the principal surface of the substrate (i.e., the side surfaces of the fin-type semiconductor region). Furthermore, the protective film also covers the top surface of the fin-type semiconductor region which is parallel to the principal surface of the substrate, and simultaneously covers the side and top surfaces of the resist pattern. Specifically, since the resist pattern is covered with the protective film, this causes the following side effect: if this state is maintained, this makes it difficult to remove the resist pattern in the subsequent cleaning process step.

Therefore, anisotropic dry etching is next performed to etch away surfaces parallel to the principal surface of the substrate (i.e., the top surface of the resist pattern), thereby removing a portion of the protective film located on the top surface of the resist pattern. In this way, before the cleaning process step, a situation is achieved where while the side surfaces of the fin-type semiconductor region and resist pattern are covered with the protective film, portions of the protective film located on the top surfaces of the fin-type semiconductor region and resist pattern are removed. This facilitates removing the resist by cleaning.

Incidentally, when a portion of the protective film located on the top surface of the resist pattern is removed, a portion of the protective film located on the top surface of the fin-type semiconductor region is also removed, and thus, the loss of the impurities on the top surface of the fin-type semiconductor region may increase. However, the amount of the impurities merely adhered to the top surface of the fin-type semiconductor region is less than that of the impurities merely adhered to the side surfaces of the fin-type semiconductor region, and thus, the loss of the impurities on the top surface due to cleaning is originally less than that of the impurities on the side surfaces. Furthermore, since, in a fin-type FET, etc., the side surfaces of the fin-type semiconductor region serve as main paths through which the on-state current passes, the protection of the side surfaces of the fin-type semiconductor region makes it difficult to cause a serious problem. Moreover, in the process step of removing a portion of the protective film located on the top surface of the resist pattern, the use of, e.g., a gas plasma obtained by lightly mixing argon into helium enables the removal of the protective film at an extremely low etching rate. This can prevent a situation where impurities in an upper portion of the fin-type semiconductor region are excessively removed after the removal of the protective film.

Next, a cleaning process step is performed using a chemical solution to remove the resist pattern. Here, ashing may be performed before the chemical cleaning. Furthermore, after the chemical cleaning, rinsing may be performed.

Next, insulative sidewall spacers are formed to protect the side surfaces of the gate electrode and the impurity-implanted layer (extension region), and then activation annealing is performed to electrically activate the impurities.

As described above, a method for fabricating a semiconductor device according to the present invention includes steps of: (a) forming a fin-type semiconductor region on a substrate; (b) after the step (a), forming a resist pattern on the substrate; (c) implanting an impurity into the fin-type semiconductor region by a plasma doping process using the resist pattern as a mask; (d) after the step (c), covering at least a side of the fin-type semiconductor region with a protective film; (e) after the step (d), removing the resist pattern by cleaning with a chemical solution; and (f) after the step (e), activating the impurity implanted into the fin-type semiconductor region by heat treatment.

According to the semiconductor device fabrication method of the present invention, before the resist pattern used as a mask for impurity implantation using plasma doping is removed by cleaning, the side surface of the fin-type semiconductor region into or to which impurities are implanted or adhered is covered with the protective film. This can prevent a situation where the impurities, e.g., adhered to the side surface of the fin-type semiconductor region by plasma doping is removed during cleaning. Therefore, an ultra-shallow extension region providing low resistance can be formed in a side portion of the fin-type semiconductor region by impurity implantation using plasma doping, thereby providing desired characteristics of the fin-type semiconductor device.

In the semiconductor device fabrication method of the present invention, in the step (d), the protective film may also cover a top surface of the resist pattern, and the method may further include, between the steps (d) and (e), at least partially removing a portion of the protective film located on the top surface of the resist pattern. This can prevent a situation where the covering of the resist pattern with the protective film makes it difficult to remove the resist pattern in the cleaning process step.

In the semiconductor device fabrication method of the present invention, in the step (d), a porous film may be formed as the protective film. Specifically, although the protective film covers not only an impurity-implanted layer (e.g., the extension region) of the fin-type semiconductor region but also the resist pattern, the formation of the porous protective film allows a chemical solution (cleaning fluid) to flow through the protective film in the cleaning process step, and thus, the cleaning fluid can reach the resist pattern. This enables reliable removal of the resist pattern in the cleaning process step. On the other hand, the cleaning fluid reaches also the impurity-implanted layer of the fin-type semiconductor region, and thus, while the impurities in portions, which are in contact with pores (micropores) of the protective film, of the surface of the impurity-implanted layer may be removed, the impurities in portions, which are in direct contact with a body portion of the protective film, of the surface of the impurity-implanted layer are not removed. Here, if the proportion of the volume of the pores of the protective film to the volume of the entire protective film is approximately one half, the formation of such a protective film can reduce the proportion (which is 1 when no protective film is formed) of the surface area of portions of the impurity-implanted layer being in contact with the cleaning fluid to the entire surface area of the impurity-implanted layer to approximately 0.5. Therefore, in this case, when the protective film is formed, the loss of the impurities in the cleaning process step can be reduced to approximately half of the loss of the impurities caused when no protective film is formed.

When a dense film is formed as the protective film, the semiconductor device fabrication method of the present invention preferably further includes, between the protective film formation step (the step (d)) and the cleaning step (the step (e)), the protective film removal step of at least partially removing a portion of the protective film located on the top surface of the resist pattern. This can further reduce the loss of the impurities on the side surface of the fin-type semiconductor region in the cleaning step, and enables more reliable removal of the resist pattern.

In the semiconductor device fabrication method of the present invention, in the step (d), the protective film may be formed at a temperature of equal to or less than 100° C. This can prevent a situation where the resist pattern is cured in the protective film formation step (the step (d)), thereby facilitating removing the resist pattern in the cleaning step.

In the semiconductor device fabrication method of the present invention, the protective film may contain the same element as the impurity. For example, when an implanted impurity is boron (B), a boro-silicate glass (BSG) film may be formed as the protective film. This can reduce the amount of the impurities diffused from the impurity-implanted layer into the protective film due to the difference in impurity concentration between the impurity-implanted layer and the protective film in the impurity activation annealing step (the step (f)). Therefore, a large amount of the impurities remaining in the impurity-implanted layer during the impurity activation annealing, i.e., a large amount of the impurities electrically activated by activation annealing to contribute to a resistance reduction, can be maintained.

In the semiconductor device fabrication method of the present invention, the thickness of the protective film may be greater than or equal to 0.5 nm and less than or equal to 10 nm. By contrast, when the thickness of the protective film is less than 0.5 nm, the protective film is so thin that it is difficult to reduce the loss of the impurities during cleaning, and when the thickness of the protective film is greater than 10 nm, the protective film is so thick that it is difficult to remove the protective film, thereby also making the resist removal difficult.

In particular, in order to provide the advantage of the present invention in fabrication of a fin-type FET, the thickness of the protective film is preferably greater than or equal to 0.5 nm and less than or equal to 10 nm. Specifically, in a fin-type FET, impurities adhered to the side surfaces of a fin-type semiconductor region needs to be protected. However, when the thickness of the protective film is less than 0.5 nm, this significantly causes a problem in which the impurities adhered to the side surfaces of the fin-type semiconductor region tends to be removed in the cleaning step. When the thickness of the protective film is greater than 10 nm, the protective film may be formed to fill the space between fin-type semiconductor regions.

Such problems will be described hereinafter with reference to FIGS. 2(a)-2(c). First, as illustrated in FIG. 2(a), a plurality of fin-type semiconductor regions (hereinafter referred to as fin-type Si regions) each having a width of Wfin and a height of Hfin should be spaced at intervals S. Next, as illustrated in FIGS. 2(b) and 2(c), a protective film should be deposited to a thickness T to cover the fin-type semiconductor regions. Here, as illustrated in FIG. 2(c), when the thickness T of the deposited protective film is less than ½·S, the thickness of a portion of the protective film located on the top surface of each fin-type semiconductor region and the thickness of a portion of the protective film located in the space between each adjacent pair of the fin-type semiconductor regions are both equal to the deposition thickness T. However, as illustrated in FIG. 2(b), when the thickness T of the deposited protective film is greater than ½·S, the protective film is formed to fill the spaces between the adjacent fin-type semiconductor regions. Thus, the thickness of a portion of the protective film located in each space is greater than the deposition thickness T, and the thickness of the protective film increases from top to bottom of the space. Specifically, the bottom of the space is covered with the protective film having an extremely large thickness of approximately T+Hfin. In this case, the portion of the protective film located in the space cannot be removed without causing damage to the fin-type semiconductor regions themselves. This makes it impossible to form insulative sidewall spacers on the side surfaces of the fin-type semiconductor regions and implant impurities in order to form source/drain regions, thereby making the fabrication of a fin-type FET difficult.

By contrast, when a fin-type FET is fabricated, the thickness of the protective film is set greater than or equal to 0.5 nm and less than or equal to 10 nm, thereby satisfying the following relationship with respect to the currently assumed interval S between each adjacent pair of the fin-type semiconductor regions:

$$T < \tfrac{1}{2} \cdot S$$

Therefore, immediately after the protective film formation step (the step (e)), the thickness of each of portions of the protective film located on the top surfaces of the fin-type semiconductor regions can be substantially equal to that of each of portions of the protective film located on the side surfaces of the fin-type semiconductor regions as illustrated in FIG. 2(c) without filling the spaces between the adjacent fin-type semiconductor regions with the protective film as illustrated in FIG. 2(b).

In the semiconductor device fabrication method of the present invention, after the step (c), the step (d) may be performed without exposure to atmosphere. For example, the steps (c) and (d) may be successively performed in a same chamber. This can prevent the impurities adhered to or implanted into the surfaces of the fin-type semiconductor regions in the impurity implantation step (the step (c)) from being oxidized between the impurity implantation step and the protective film formation step (the step (d)). In particular, when an object to be fabricated is a fin-type FET, it is significant, in order to provide the advantage of the present invention, to form a protective film without exposure to atmosphere (e.g., with the substrate kept in a vacuum) after the impurity implantation step. The reason for this is as follows. In the fabrication of a fin-type FET, when the proportion between the amount of impurities implanted into semiconductor in the impurity implantation step and the amount of impurities adhered to the surface of semiconductor in the above step is compared between the side and top surfaces of the fin-type semiconductor regions, the proportion of the amount of the impurities merely adhered to portions of the surface of semiconductor corresponding to the side surfaces is greater. The impurities merely adhered to the surface of semiconductor as described above is also electrically activated by being diffused into semiconductor in the activation annealing step, thereby contributing to a resistance reduction. However, when the impurities merely adhered to the surface of semiconductor is oxidized, e.g., by being bonded to oxygen in the air before the activation annealing step, this makes it difficult to electrically activate such oxidized impurities even with diffusion of the oxidized impurities into semiconductor in the activation annealing step, and thus, the oxidized impurities does not contribute to a resistance reduction. Therefore, the side surfaces of the fin-type semiconductor regions are advantageously covered with the protective film before the impurities adhered to the above side surfaces is oxidized. In order to achieve this, as described above, a protective film may be formed after the impurity implantation step without exposing the target substrate to the air (e.g., with the target substrate kept in a vacuum).

The semiconductor device fabrication method of the present invention may further include, between the steps (a) and (b), forming a gate electrode astride the fin-type semiconductor region. In the step (d), the protective film may be formed on at least a side of the gate electrode, and the method may further include, after the step (e), forming an insulative sidewall spacer on the side of the gate electrode with the protective film interposed between the sidewall spacer and the gate electrode.

A semiconductor device obtained by the above-described semiconductor device fabrication method of the present invention, i.e., a semiconductor device of the present invention, includes: a fin-type semiconductor region formed on a substrate; a gate electrode formed astride the fin-type semiconductor region; an extension region formed in at least a side of a portion of the fin-type semiconductor region adjacent to the gate electrode; and an insulative sidewall spacer formed to cover the extension region. An implanted impurity protection film is formed between the extension region and the insulative sidewall spacer.

According to the semiconductor device of the present invention, the implanted impurity protection film is formed between the extension region and the insulative sidewall spacer. This can prevent a situation where the impurities, e.g., adhered to the side surface of the fin-type semiconductor region by plasma doping is removed during cleaning. Therefore, an ultra-shallow extension region providing low resistance can be formed in a side portion of the fin-type semiconductor region by impurity implantation using plasma doping, thereby providing desired characteristics of the fin-type semiconductor device.

In the semiconductor device of the present invention, a top surface of a portion of the fin-type semiconductor region adjacent to the gate electrode may be at least partially in contact with the insulative sidewall spacer. Specifically, a portion of the implanted impurity protection film located on the top surface of a portion of the fin-type semiconductor region adjacent to the gate electrode may be at least partially removed. Thus, a portion of the implanted impurity protection film located on the top surface of a resist pattern used as a mask in impurity implantation for forming the extension region is also at least partially removed. This can prevent a situation where the covering of the resist pattern with the implanted impurity protection film makes it difficult to remove the resist pattern in the cleaning step.

In the semiconductor device of the present invention, the implanted impurity protection film may be a porous film. Specifically, the implanted impurity protection film covers not only the extension region but also the resist pattern used as a mask in impurity implantation for forming the extension region. However, the formation of the porous implanted impurity protection film allows a chemical solution (cleaning fluid) to flow through the implanted impurity protection film in the cleaning step, and thus, the cleaning fluid can reach the resist pattern. This enables reliable removal of the resist pattern in the cleaning step.

In the semiconductor device of the present invention, the implanted impurity protection film may cover a side surface of the gate electrode and a side surface of the fin-type semiconductor region serving as a source/drain region. Similarly, the insulative sidewall spacer may cover a side surface of the gate electrode and a side surface of the fin-type semiconductor region serving as the source/drain region.

Advantages of the Invention

According to the present invention, the loss of the impurities, e.g., adhered to the side surfaces of the fin-type semiconductor region due to cleaning can be reduced, and thus, a low-resistance region can be formed in a side portion of the fin-type semiconductor region, thereby preventing degradation in characteristics of a three-dimensional device, such as a fin-type FET.

DESCRIPTION OF EMBODIMENTS (First Embodiment)

A semiconductor device (specifically, a fin-type FET) according to a first embodiment of the present invention and a method for fabricating the same will be described hereinafter with reference to the drawings.

In this embodiment, impurities are implanted into or adhered to the top and side surfaces of fin-type semiconductor regions by plasma doping, and then the side surfaces of the fin-type semiconductor regions are covered with a dense protective film having a thickness of less than or equal to half of the interval between each adjacent pair of the fin-type semiconductor regions to thereby protect the impurities adhered to the side surfaces, thereby increasing the on-state current of the fin-type FET.

FIGS. 3(a)-3(d) and 4(a)-4(d) are perspective views illustrating process steps in a method for fabricating a semiconductor device according to this embodiment. FIGS. 5(a), 5(b), and 5(c) are cross-sectional views taken along the line A1-A1 (the gate length direction), the line A2-A2 (the gate width direction), and the line A3-A3 (source/drain formation regions), respectively, in FIG. 3(a), and FIGS. 5(d), 5(e), and 5(f) are cross-sectional views taken along the line B1-B1 (the gate length direction), the line B2-B2 (the gate width direction), and the line B3-B3 (source/drain formation regions), respectively, in FIG. 3(b). FIGS. 6(a), 6(b), and 6(c) are cross-sectional views taken along the line C1-C1 (the gate length direction), the line C2-C2 (the gate width direction), and the line C3-C3 (source/drain formation regions), respectively, in FIG. 3(c), and FIGS. 6(d), 6(e), and 6(f) are cross-sectional views taken along the line D1-D1 (the gate length direction), the line D2-D2 (the gate width direction), and the line D3-D3 (source/drain formation regions), respectively, in FIG. 3(d). FIGS. 7(a), 7(b), and 7(c) are cross-sectional views taken along the line A1-A1 (the gate length direction), the line A2-A2 (the gate width direction), and the line A3-A3 (source/drain formation regions), respectively, in FIG. 4(a), and FIGS. 7(d), 7(e), and 7(f) are cross-sectional views taken along the line B1-B1 (the gate length direction), the line B2-B2 (the gate width direction), and the line B3-B3 (source/drain formation regions), respectively, in FIG. 4(b). FIGS. 8(a), 8(b), 8(c), and 8(d) are cross-sectional views taken along the line C1-C1 (the gate length direction), the line C2-C2 (the gate width direction), the line C3-C3 (source/drain formation regions), and the line C4-C4 (extension formation regions), respectively, in FIG. 4(c), and FIGS. 8(e), 8(f), 8(g), and 8(h) are cross-sectional views taken along the line D1-D1 (the gate length direction), the line D2-D2 (the gate width direction), the line D3-D3 (source/drain formation regions), and the line D4-D4 (extension formation regions), respectively, in FIG. 4(d).

Figure 1:
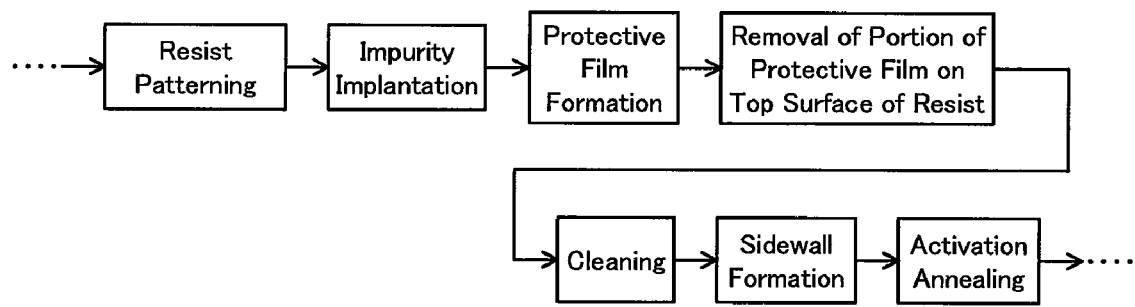
FIG. 1 is a flow chart illustrating a specific example of a method for fabricating a fin-type semiconductor device according to the present invention.
Figure 2:
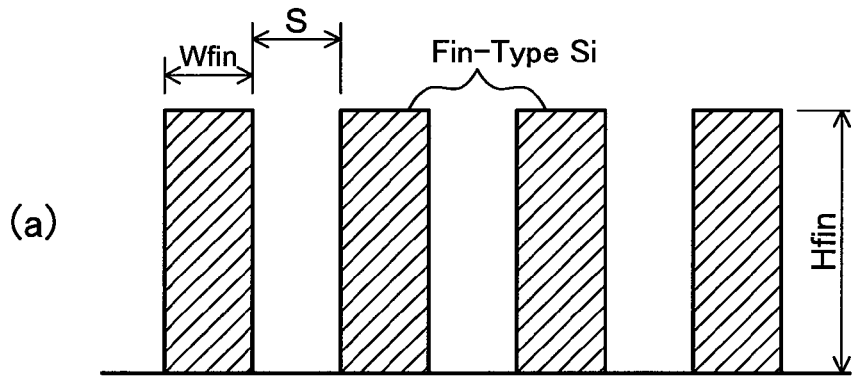
FIGS. 2(a)-2(c) are diagrams for explaining a problem in which, in the method for fabricating a fin-type semiconductor device according to the present invention, a protective film is formed to fill the spaces between adjacent fin-type semiconductor regions.
Figure 2:
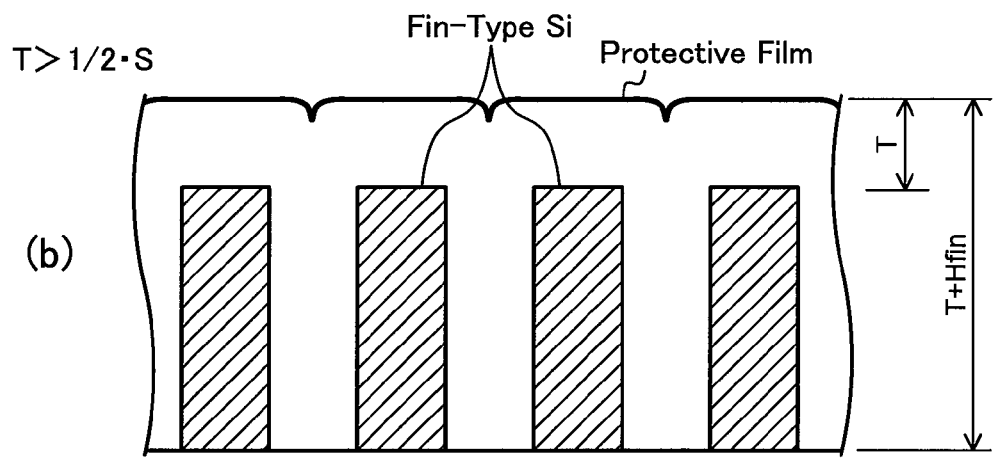
Figure 2:
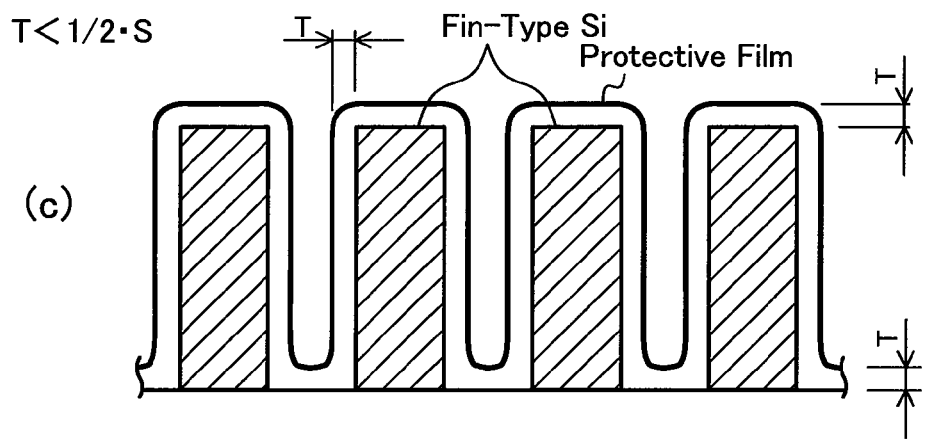
Figure 3:
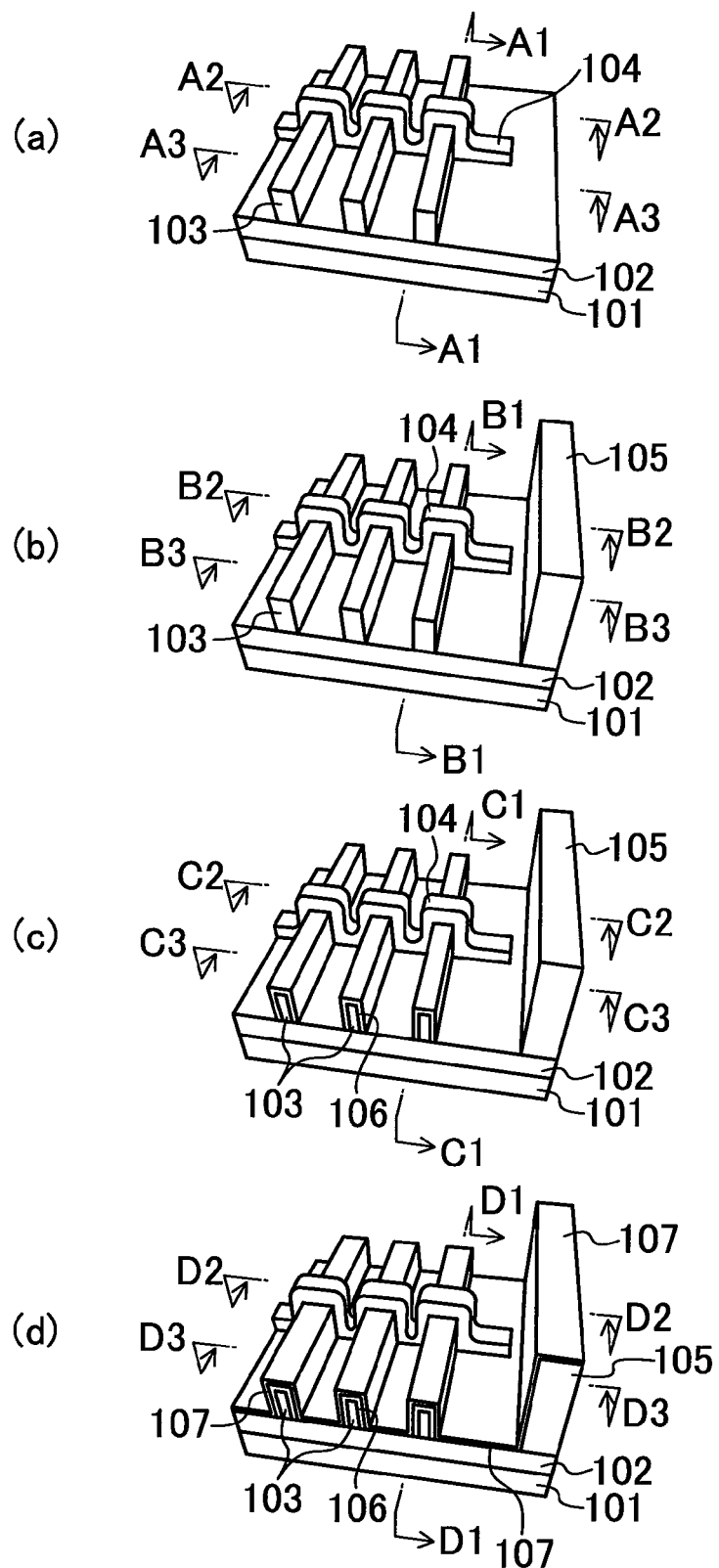
FIGS. 3(a)-3(d) are perspective views illustrating process steps in a method for fabricating a semiconductor device according to a first embodiment of the present invention.
Figure 4:
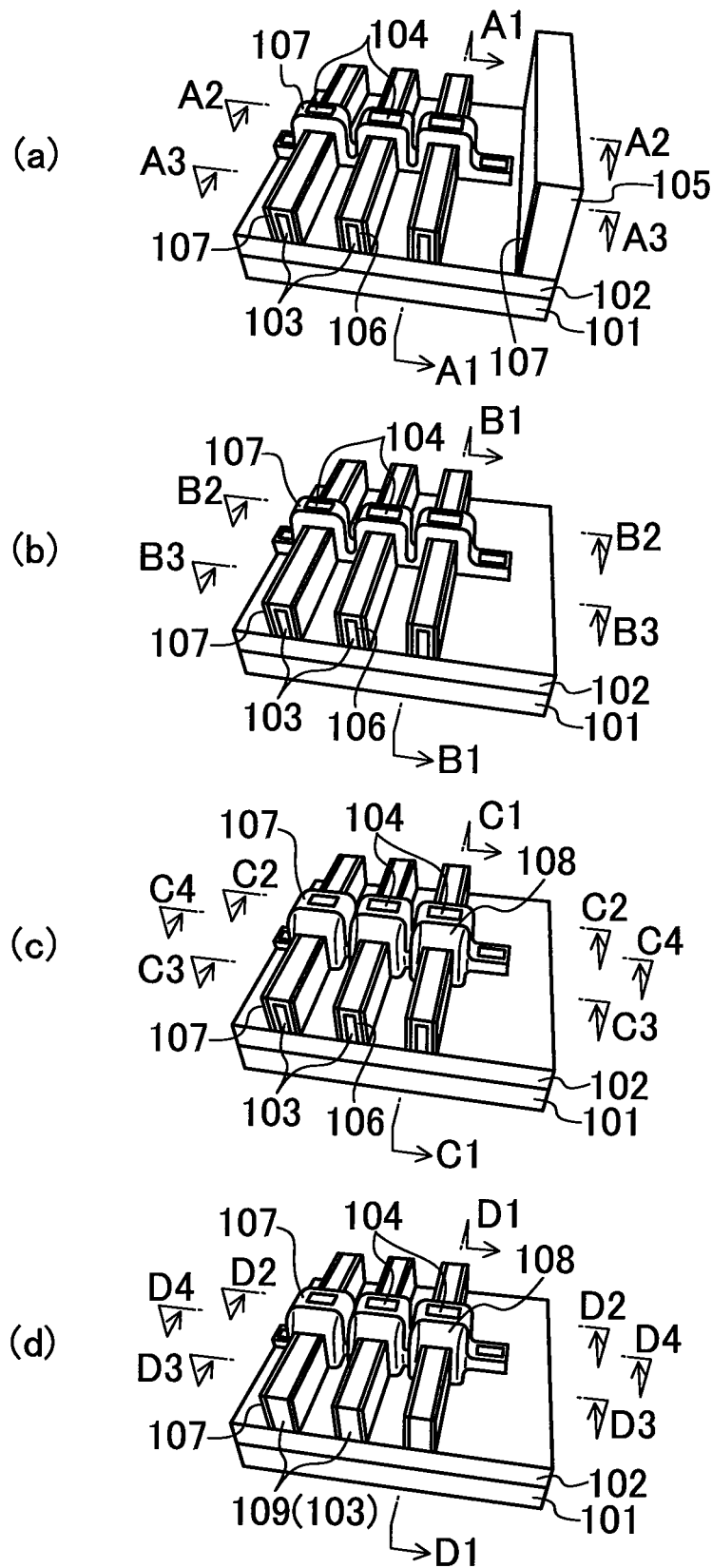
FIGS. 4(a)-4(d) are perspective views illustrating other process steps in the method for fabricating a semiconductor device according to the first embodiment of the present invention.
Figure 5:
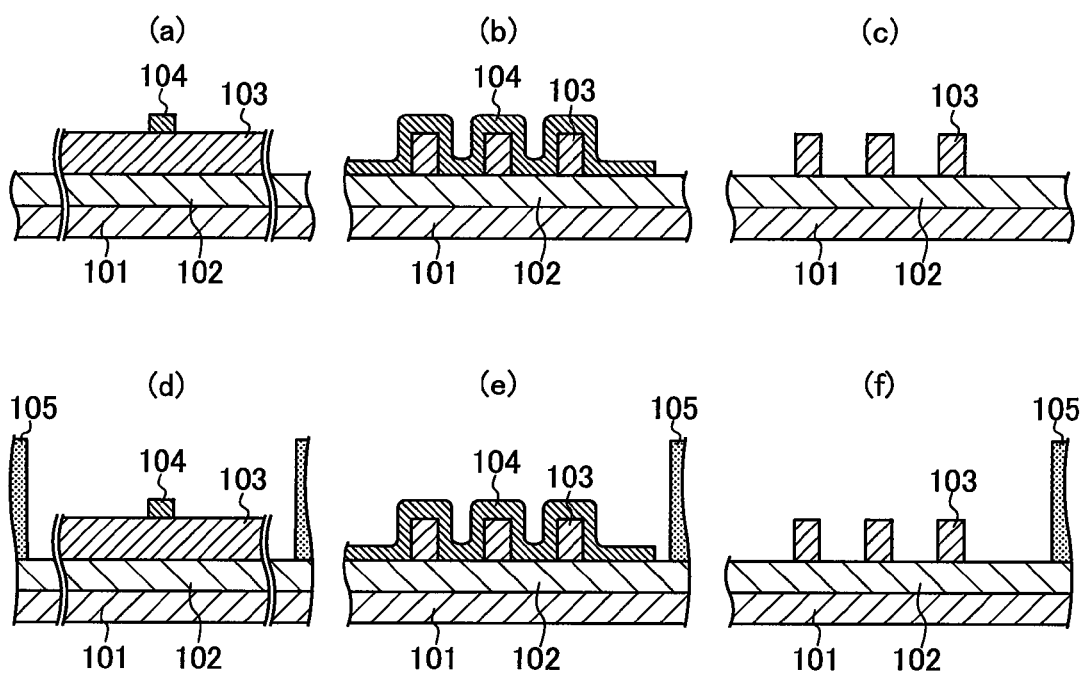
FIGS. 5(a), 5(b), and 5(c) are cross-sectional views taken along the line A1-A1 (the gate length direction), the line A2-A2 (the gate width direction), and the line A3-A3 (source/drain formation regions), respectively, in FIG. 3(a), and FIGS. 5(d), 5(e), and 5(f) are cross-sectional views taken along the line B1-B1 (the gate length direction), the line B2-B2 (the gate width direction), and the line B3-B3 (source/drain formation regions), respectively, in FIG. 3(b).
Figure 6:
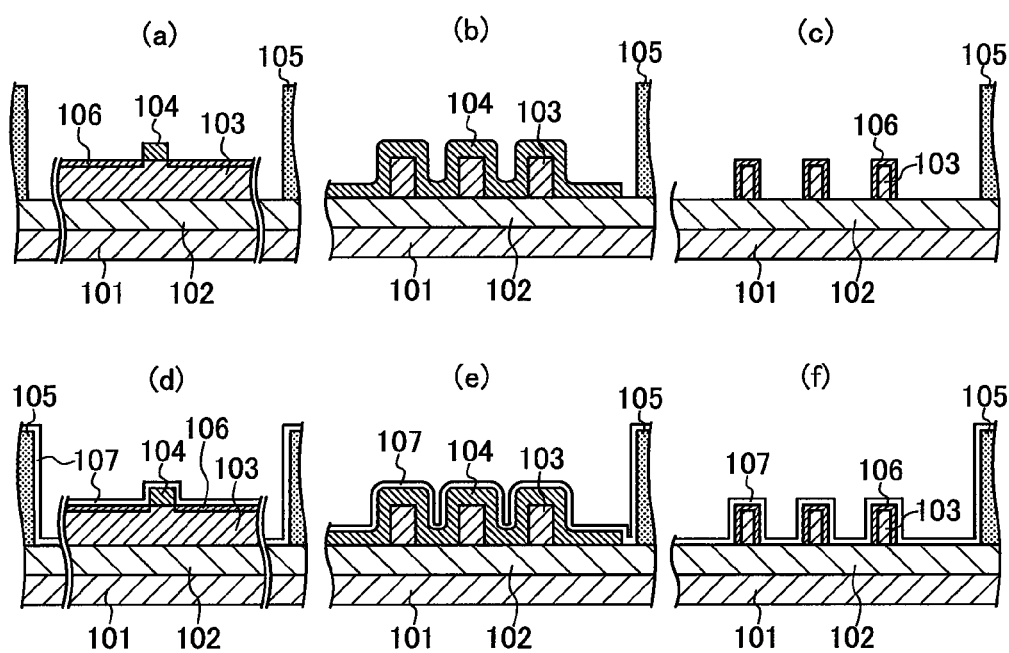
FIGS. 6(a), 6(b), and 6(c) are cross-sectional views taken along the line C1-C1 (the gate length direction), the line C2-C2 (the gate width direction), and the line C3-C3 (source/drain formation regions), respectively, in FIG. 3(c), and FIGS. 6(d), 6(e), and 6(f) are cross-sectional views taken along the line D1-D1 (the gate length direction), the line D2-D2 (the gate width direction), and the line D3-D3 (source/drain formation regions), respectively, in FIG. 3(d).
Figure 7:
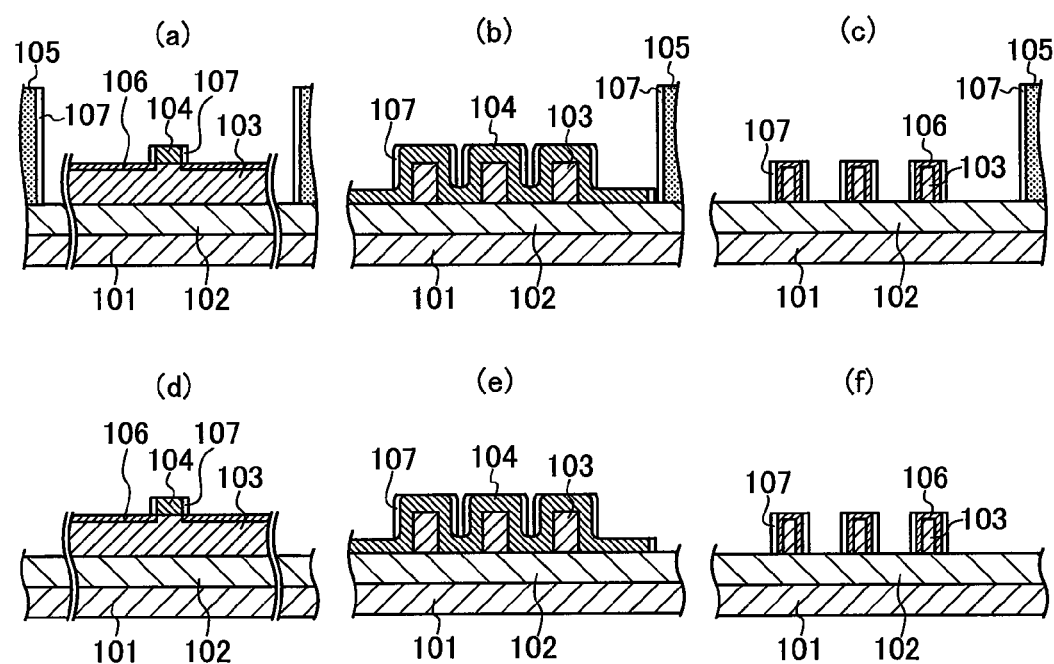
FIGS. 7(a), 7(b), and 7(c) are cross-sectional views taken along the line A1-A1 (the gate length direction), the line A2-A2 (the gate width direction), and the line A3-A3 (source/drain formation regions), respectively, in FIG. 4(a), and FIGS. 7(d), 7(e), and 7(f) are cross-sectional views taken along the line B1-B1 (the gate length direction), the line B2-B2 (the gate width direction), and the line B3-B3 (source/drain formation regions), respectively, in FIG. 4(b).

FIGS. 5(a), 5(d), 6(a), 6(d), 7(a), 7(d), 8(a), and 8(e) each illustrate a cross-sectional structure of a region which is wider than the region illustrated by the perspective view in FIGS. 3(a)-3(d) and 4(a)-4(d), and FIGS. 8(d) and 8(h) each illustrate a cross-sectional structure of a portion of the region illustrated by the perspective view in FIGS. 4(c) and 4(d).

In the fabrication method for a semiconductor device according to the present invention, as illustrated in FIGS. 3(a) and 5(a)-5(c), for example, a silicon on insulator (SOI) substrate including a silicon substrate 101 on which a BOX oxide film 102 and a silicon layer are sequentially stacked is first prepared, and then the silicon layer is patterned, thereby forming a plurality of fin-type semiconductor regions 103 on the silicon substrate 101 with the BOX oxide film 102 interposed therebetween. Next, a gate electrode 104 is formed astride predetermined portions (channel regions) of the fin-type semiconductor regions 103 in the gate width direction. Here, the width (width in the gate width direction: Wfin) of each of the fin-type semiconductor regions 103 is, for example, 10 nm, the height (Hfin) thereof is, for example, 60 nm, the interval (S) between each adjacent pair of the fin-type semiconductor regions 103 is 10 nm, and the width (width in the gate length direction: Wg) of the gate electrode 104 is 20 nm. A gate insulating film which is not shown is formed between the top and side surfaces of the fin-type semiconductor regions 103 and the gate electrode 104.

Next, as illustrated in FIGS. 3(*b*) and 5(*d*)-5(*f*), a resist pattern 105 is formed on the substrate to have an opening on a desired region into which impurities are to be implanted. For example, the resist pattern 105 is formed to have an opening on a p-type FET formation region including the fin-type semiconductor regions 103 and the gate electrode 104 and cover an n-type FET formation region. Here, the height of the resist pattern 105 is set at, e.g., approximately 200 nm.

Next, as illustrated in FIGS. 3(*c*) and 6(*a*)-6(*c*), the entire substrate surface is exposed to a plasma containing boron by plasma doping using the resist pattern 105 and the gate electrode 104 as masks. This enables the formation of extension regions 106 in upper and side portions of the fin-type semiconductor regions 103 outside the gate electrode 104. Here, the plasma doping conditions are such that the material gas is $B_2H_6$ diluted with He, the $B_2H_6$ concentration in the material gas is 0.5% by mass, the internal chamber pressure is 0.35 Pa, the source power (the plasma-generating high-frequency power) is 500 W, the bias voltage Vpp is 250 V, the substrate temperature is 20° C., and the plasma doping time is 60 seconds. For example, an ICP method is used as the plasma generation method.

In a plasma doping process step illustrated in FIGS. 3(*c*) and 6(*a*)-6(*c*), boron is adhered to or implanted into the top and side surfaces of the fin-type semiconductor regions 103. Here, the implanted boron corresponds to boron ions existing in the plasma and accelerated by the bias voltage. By contrast, the adhered boron corresponds to boron atoms radicalized in the plasma, and molecules containing the radicalized boron atoms, and merely has much lower energy than the boron ions accelerated by the bias voltage. For example, in this embodiment, monovalent boron ions accelerated by a bias voltage Vpp of 250 V have an acceleration energy of 125 electron volts (eV). By contrast, since the boron atoms radicalized in the plasma are active but carry no electrical charge, the boron atoms cannot draw energy from the bias voltage, and thus, merely have one or more orders of magnitude lower energy than boron ions. Therefore, the boron atoms radicalized in the plasma, and molecules containing the radicalized boron atoms are adhered principally to the substrate surface and the surfaces of the semiconductor regions.

Incidentally, the direction in which ions are accelerated by the bias voltage is vertical to the principal surface of the substrate. Therefore, even in consideration of random kinetic energy due to thermal agitation in the plasma, the kinetic energy due to the thermal agitation is lower than the acceleration energy provided by the bias voltage. Therefore, assuming that when the ion entrance angle (the angle from the direction of the normal of the principal surface of the substrate) at which ions accelerated by the bias voltage enter the principal surface of the substrate (i.e., the top surfaces of the fin-type semiconductor regions) is 0 degrees, this angle is vertical to the principal surface of the substrate, the ion entrance angles are merely distributed within the range of approximately −5 degrees through approximately +5 degrees. Thus, the ions accelerated by the bias voltage enter the principal surface of the substrate generally vertically. Therefore, in the plasma doping process step illustrated in FIGS. 3(*c*) and 6(*a*)-6(*c*), the boron ions accelerated by the bias voltage enter the top surfaces of the fin-type semiconductor regions 103 from a nearly vertical direction while entering the side surfaces of the fin-type semiconductor regions 103 from a nearly horizontal direction. While many of the ions entering the fin-type semiconductor regions 103 from the nearly vertical direction enter the inside of semiconductor, many of the ions entering the fin-type semiconductor regions 103 from the nearly horizontal direction are repelled from the surface of semiconductor, thereby reducing the number of such ions entering the inside of semiconductor. Specifically, ions entering the top surfaces of the fin-type semiconductor regions 103 at an ion entrance angle of 5 degrees enter the side surfaces of the fin-type semiconductor regions 103 at an ion entrance angle of 85 degrees. When such ions entering the surface of semiconductor at a large ion entrance angle merely have low energy, such as when the bias voltage Vpp is approximately 250 V as in this embodiment, the number of ions implanted from the side surfaces of the fin-type semiconductor regions 103 into the fin-type semiconductor regions 103 is extremely low, such as less than 10% of the number of ions entering the side surfaces.

As described above, in the plasma doping process step illustrated in FIGS. 3(*c*) and 6(*a*)-6(*c*), while boron is adhered to or implanted into the top and side surfaces of the fin-type semiconductor regions 103, how boron enters the inside of semiconductor from the top surface is significantly different from how boron enters the inside of semiconductor from the side surfaces. Specifically, while there exists a relatively large amount of boron implanted from the top surfaces of the fin-type semiconductor regions 103 into semiconductor, the amount of boron implanted from the side surfaces of the fin-type semiconductor regions 103 into semiconductor is extremely small, such as less than 10% of the number of boron implanted from the top surfaces thereof thereinto, and there exists a large amount of boron merely adhered to the side surfaces of the fin-type semiconductor regions 103.

Next, as illustrated in FIGS. 3(*d*) and 6(*d*)-6(*f*), the entire substrate surface is covered with a protective film 107. Here, in order to prevent curing of the resist pattern 105, the protective film 107 is preferably deposited at a low temperature of less than or equal to 100° C. Specifically, the protective film 107 made of a silicon oxide film, a silicon oxynitride film, etc., is deposited, e.g., by sputtering, electron cyclotron resonance plasma chemical vapor deposition (CVD), or physical vapor deposition.

The case where the protective film 107 is formed by one of physical vapor deposition techniques, vacuum deposition, will be exemplified hereinafter in detail. An evaporation source and a target substrate are first placed in a vacuum chamber having a pressure of approximately $10^{-2}$-$10^{-4}$ Pa. Thereafter, a thin film formation material is evaporated by applying heat to the evaporation source, and the material is adhered to the target substrate, thereby forming a protective film 107. In this case, the mean free path of the thin film formation material is approximately tens of centimeters to tens of meters, and thus, particles of the thin film formation material evaporated from the evaporation source hardly collide with one another, and reach the target substrate. Here, since the energy of the evaporated particles is low, such as approximately 0.1-1 eV, vacuum deposition causes only minor damage to the target substrate, and is less likely to cause the film to contain an impure material (an unintended contaminant), while tending to cause the film to be porous. Therefore, gas ions with an energy of approximately hundreds of eV, and electrons which are configured to electrically neutralize the gas ions and the amount of which is identical with the amount of the gas ions are applied to the target substrate using an ion gun during vacuum deposition, thereby depositing a dense protective film 107 with a smooth surface.

Specifically, in this embodiment, a dense protective film 107 may be formed, e.g., using this process called ion beam assisted deposition.

In this embodiment, the thickness of the protective film 107 can be optionally set within the range of, e.g., approximately 0.5-10 nm, depending on the interval (S) between each adjacent pair of the fin-type semiconductor regions 103. However, when the interval (S) is, for example, 10 nm, the thickness of the protective film 107 can be set at, e.g., 3 nm to prevent the spaces between the adjacent fin-type semiconductor regions 103 from being filled with the protective film 107. The protective film 107 covers not only the side surfaces of the fin-type semiconductor regions 103 but also the top surfaces of the fin-type semiconductor regions 103 and the top and side surfaces of the resist pattern 105.

Next, as illustrated in FIGS. 4(a) and 7(a)-7(c), in order to remove a portion of the protective film 107 located on the top surface of the resist pattern 105, for example, plasma etching is performed. This enables the removal of not only the portion of the protective film 107 located on the top surface of the resist pattern 105 but also portions of the protective film 107 located on the top surfaces of the fin-type semiconductor regions 103 and the top surface of the BOX oxide film 102. Here, the portion of the protective film 107 located on the top surface of the resist pattern 105 may be at least partially removed. A plasma of, e.g., a gas obtained by diluting argon with helium, or a plasma of helium is preferably used as a plasma for use in etching. The reason for this is as follows.

Although a purpose of the process step illustrated in FIGS. 4(a) and 7(a)-7(c) is to remove the portion of the protective film 107 located on the top surface of the resist pattern 105, not only the portion of the protective film 107 located on the top surface of the resist pattern 105 but also the portions of the protective film 107 located on the top surfaces of the fin-type semiconductor regions 103 are simultaneously removed in this process step as described above. Here, in a fin-type FET, side portions of the fin-type semiconductor regions 103 serve as main paths through which the on-state current passes, and thus, it is not a serious problem to remove the portions of the protective film 107 located on the top surfaces of the fin-type semiconductor regions 103. However, when the portions of the protective film 107 located on the top surfaces of the fin-type semiconductor regions 103 are completely removed, and then the etching further proceeds so that the fin-type semiconductor regions 103 themselves are etched away to a large extent, this adversely affects the semiconductor device. Therefore, in this embodiment, the etching rate is set relatively low in order to prevent the semiconductor device from being adversely affected, and thus, helium (He) containing the smallest atoms among chemically stable rare gas atoms is used as a diluent gas. Argon, neon, or helium is used as an etching gas. Here, since argon and neon are also rare gases and chemically stable, this can further reduce the adverse effect on the semiconductor device. However, when argon is used as an etching gas, this provides a higher etching rate than when neon or helium is used, and thus, when the protective film 107 is relatively thick within the range of, e.g., 0.5-10 nm, argon is preferably used as the etching gas because the etching time can be reduced. Furthermore, when neon is used as an etching gas, this can provide a lower etching rate than when argon is used, and thus, when the protective film 107 is relatively thin within the range of, e.g., 0.5-10 nm, and the time required for the etching using argon is too short to provide a stable process, neon is preferably used as the etching gas because the use of neon can increase the etching time to some extent to provide a stable process. Moreover, when the protective film 107 is extremely thin, helium is preferably used as an etching gas because the use of helium can increase the etching time to some extent to provide a stable process.

In this embodiment, plasma etching is performed using, e.g., Ar diluted with He in order to remove a portion of the protective film 107 located on the top surface of the resist pattern 105. The plasma etching conditions are such that the internal chamber pressure is 1 Pa, the source power (the plasma-generating high-frequency power) is 1250 W, and the bias voltage Vpp is 300-350 W. Here, when the Ar concentration in the plasma is 10% by mass (the He concentration therein is 90% by mass), the etching rate of silicon is approximately 0.3 nm/second, and when the plasma is a He gas plasma into which Ar is not mixed, the etching rate of silicon is approximately 0.03 nm/second. As such, the etching rate can be adjusted by adjusting the Ar concentration.

Specifically, when the Ar concentration in the plasma is 10% by mass, the He concentration therein is 90% by mass, the internal chamber pressure is 1 Pa, the source power is 1250 W, the bias voltage is 325 W, and the process time is 10 seconds, this enables the removal of a portion of a 3-nm-thick oxynitride silicon film (protective film 107) located on the top surface of the resist pattern 105. In this case, although, simultaneously, portions of the oxynitride silicon film (protective film 107) located on the top surfaces of the fin-type semiconductor regions 103 are also removed, thick portions of the fin-type semiconductor regions 103 having a thickness of greater than 1 nm are not etched away. Since plasma etching using the above-described mixture of Ar and He corresponds to ion etching mainly using Ar ions, ions accelerated vertically to the principal surface of the substrate by the bias voltage collide with an object, thereby etching the object away. Therefore, while only portions of the protective film 107 located on the top surfaces of the fin-type semiconductor regions 103 and the top surface of the resist pattern 105 are etched away, portions of the protective film 107 located on the side surfaces of the fin-type semiconductor regions 103 and the side surfaces of the resist pattern 105 remain. Specifically, after the plasma etching, as illustrated in FIGS. 4(a) and 7(a)-7(c), while the side surfaces of the fin-type semiconductor regions 103 are protected by the protective film 107, the top surface of the resist pattern 105 is exposed. As illustrated in FIGS. 4(a) and 7(a)-7(c), portions of the protective film 107 located on the side surfaces of the gate electrode 104 also remain.

Figure 12:
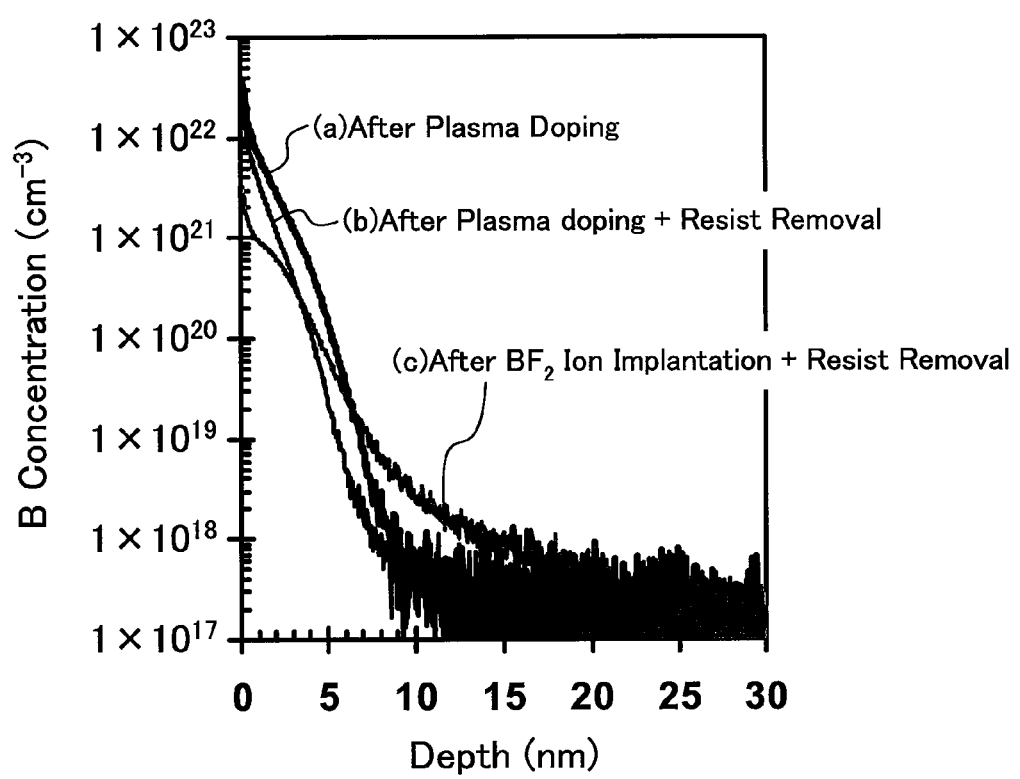
FIG. 12 is a diagram illustrating the result obtained after the present inventors investigated the relationship between the amount of impurities implanted by plasma doping and the loss of the impurities in a subsequent cleaning process step.

Next, the entire substrate surface is brought into contact with a chemical solution, e.g., a cleaning fluid, such as SPM or APM, thereby removing the resist pattern 105 as illustrated in FIGS. 4(b) and 7(d)-7(f). When a metal material, such as tungsten (W) or tantalum (Ta), is used as a material of the gate electrode 104, the use of a cleaning fluid containing an oxidizer ($H_2O_2$) causes oxidative dissolution of such metals. Therefore, a cleaning fluid which does not contain an oxidizer ($H_2O_2$) is preferably used to prevent dissolution of such metals. Furthermore, the resist pattern 105 is dissolved in the cleaning fluid in a sequential order from the top surface of the resist pattern 105 so as to be stripped off, and simultaneously, portions of the protective film 107 remaining on the side surfaces of the resist pattern 105 are also removed together with the resist pattern 105. Since the side surfaces of the fin-type semiconductor regions 103 and boron adhered to the side surfaces thereof in the plasma doping process step illustrated in FIGS. 3(c) and 6(a)-6(c) are covered with the protective film 107, the boron is maintained between the side surfaces of the fin-type semiconductor regions 103 and the protective film 107 without being removed even during the above-described cleaning. By contrast, although portions of the protective film 107 located on the top surfaces of the fin-type semiconductor regions 103 are removed in the plasma etching process step illustrated in FIGS. 4(a) and 7(a)-7(c), approximately half or more of boron entering the top surfaces of the fin-type semiconductor regions 103 in the plasma doping process step illustrated in FIGS. 3(c) and 6(a)-6(c) is implanted into semiconductor (see FIG. 12). Specifically, the amount of boron removed from the top surfaces of the fin-type semiconductor regions 103 during the above-described cleaning is approximately half or less of the amount of the entering boron. Thus, as seen by comparing the graph (b) in FIG. 12 with the graph (c) therein, the impurity concentration in a portion of the extension region 106 corresponding to an upper portion of each fin-type semiconductor region 103 can be kept higher than when a conventional $BF_2$ ion implantation is used.

Figure 8:
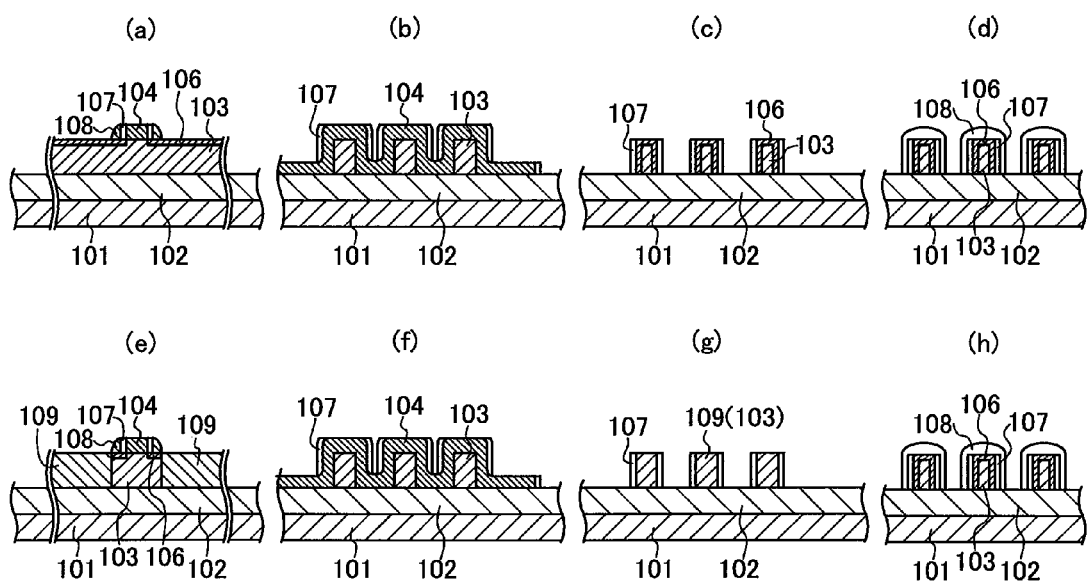
FIGS. 8(a), 8(b), 8(c), and 8(d) are cross-sectional views taken along the line C1-C1 (the gate length direction), the line C2-C2 (the gate width direction), the line C3-C3 (source/drain formation regions), and the line C4-C4 (extension formation regions), respectively, in FIG. 4(c), and FIGS. 8(e), 8(f), 8(g), and 8(h) are cross-sectional views taken along the line D1-D1 (the gate length direction), the line D2-D2 (the gate width direction), the line D3-D3 (source/drain formation regions), and the line D4-D4 (extension formation regions), respectively, in FIG. 4(d).

Next, as illustrated in FIGS. 4(c) and 8(a)-8(d), insulative sidewall spacers 108 are formed on the side surfaces of the gate electrode 104 with the protective film 107 interposed therebetween. Thus, the extension regions 106 are protected by the insulative sidewall spacers 108. Here, as illustrated in FIG. 8(d), the protective film 107 is interposed between portions of the extension regions 106 located in side portions of regions of the fin-type semiconductor regions 103 adjacent to the gate electrode 104, and the insulative sidewall spacers 108. By contrast, as illustrated in FIG. 8(a), no protective film 107 is interposed between portions of the extension regions 106 located in upper portions of regions of the fin-type semiconductor regions 103 adjacent to the gate electrode 104, and insulative sidewall spacers 108. In other words, the top surfaces of regions of the fin-type semiconductor regions 103 (extension regions 106) adjacent to the gate electrode 104 are at least partially in contact with the insulative sidewall spacers 108.

Next, impurities, such as boron, are relatively deeply implanted into the fin-type semiconductor regions 103 using the gate electrode 104 and the insulative sidewall spacers 108 as masks, thereby forming source/drain regions 109 as illustrated in FIGS. 4(d) and 8(e)-8(f). In this case, the protective film 107 may be formed on the side surfaces of the fin-type semiconductor regions 103 serving as the source/drain regions 109. Alternatively, the insulative sidewall spacers 108 may be formed on the side surfaces of the fin-type semiconductor regions 103 serving as the source/drain regions 109 with the protective film 107 interposed therebetween.

Thereafter, activation annealing is performed to electrically activate boron in the extension regions 106 and the source/drain regions 109. In this case, boron adhered to the surfaces of portions of the extension regions 106 located in side portions of the fin-type semiconductor regions 103 in the plasma doping process step illustrated in FIGS. 3(c) and 6(a)-6(c) is sufficiently maintained without being removed during the above-described cleaning. Therefore, since activation annealing enables electrical activation of a large amount of boron, this can reduce the resistance of the portions of the extension regions 106 located in the side portions of the fin-type semiconductor regions 103.

A principal portion of the fin-type FET of this embodiment is completed through the above-described process steps.

According to the first embodiment, before the resist pattern 105 used as a mask for impurity implantation using plasma doping is removed by cleaning, the side surfaces of the fin-type semiconductor regions 103 into or to which impurities are implanted or adhered are covered with the protective film 107. This can prevent a situation where the impurities, e.g., adhered to the side surfaces of the fin-type semiconductor regions 103 by plasma doping is removed during cleaning. Therefore, ultra-shallow extension regions 106 providing low resistance can be formed in side portions of the fin-type semiconductor regions 103 by impurity implantation using plasma doping, thereby providing desired characteristics of the fin-type FET.

According to the first embodiment, the process step of at least partially removing a portion of the protective film 107 located on the top surface of the resist pattern 105 is further provided between the process step of forming the protective film 107 and the process step of removing the resist pattern 105 by cleaning. This can prevent a situation where the covering of the resist pattern 105 with the protective film 107 makes it difficult to remove the resist pattern 105 in the cleaning process step.

Furthermore, according to the first embodiment, since the protective film 107 is formed at a low temperature of less than or equal to 100° C., this can prevent a situation where the resist pattern 105 is cured during the formation of the protective film 107, thereby facilitating removing the resist pattern 105 in the cleaning process step.

In the first embodiment, the protective film 107 may contain the same element as an impurity for forming the extension regions 106. For example, when an implanted impurity is boron (B), a boro-silicate glass (BSG) film may be formed as the protective film 107. This can reduce the amount of the impurities diffused from the extension regions 106 into the protective film 107 due to the difference in impurity concentration between the extension regions 106 and the protective film 107 in an impurity activation annealing process step. Therefore, a large amount of the impurities remaining in the extension regions 106 in the impurity activation annealing, i.e., a large amount of the impurities electrically activated by activation annealing to contribute to a resistance reduction, can be maintained.

In the first embodiment, the thickness of the protective film 107 is preferably greater than or equal to 0.5 nm and less than or equal to 10 nm. The reason for this is that when the thickness of the protective film 107 is less than 0.5 nm, the protective film 107 is so thin that it is difficult to reduce the loss of the impurities during cleaning, and when the thickness of the protective film 107 is greater than 10 nm, the protective film 107 is so thick that it is difficult to remove the protective film 107.

In the first embodiment, after the process step of forming extension regions 106 (plasma doping process step), the protective film 107 may be formed without exposure to the atmosphere. For example, the process step of forming extension regions 106 and the process step of forming a protective film 107 may be successively performed in the same chamber. This can prevent the impurities adhered to or implanted into the surfaces of the fin-type semiconductor regions 103 in the process step of forming the extension regions 106 from being oxidized between the process step of forming the extension regions 106 and the process step of forming the protective film 107.

In the first embodiment, ashing may be performed before the resist pattern 105 is removed by chemical cleaning. Alternatively, rinsing using water may be performed after the resist pattern 105 is removed by chemical cleaning.

In the first embodiment, p-type extension regions 106 and source/drain regions 109, i.e., a p-type FET, is formed using, e.g., boron as a p-type impurity. However, alternatively, n-type extension regions 106 and source/drain regions 109, i.e., an n-type FET, may be formed using, e.g., phosphorus as an n-type impurity.

(Second Embodiment)

A semiconductor device (specifically, a fin-type FET) according to the second embodiment of the present invention and a method for fabricating the same will be described hereinafter with reference to the drawings.

In this embodiment, impurities are implanted into or adhered to the top and side surfaces of fin-type semiconductor regions by plasma doping, and then the side and top surfaces of the fin-type semiconductor regions are covered with a porous protective film having a thickness of less than or equal to half of the interval between each adjacent pair of the fin-type semiconductor regions to thereby protect the impurities adhered to the fin-type semiconductor regions, thereby increasing the on-state current of the fin-type FET.

Specifically, this embodiment is different from the first embodiment mainly in that a porous film is used as a protective film, and that the protective film is not removed from the top surfaces of the fin-type semiconductor regions, etc.

FIGS. 9(a)-9(d) are perspective views illustrating process steps in a method for fabricating a semiconductor device according to this embodiment. FIGS. 10(a), 10(b), and 10(c) are cross-sectional views taken along the line A1-A1 (the gate length direction), the line A2-A2 (the gate width direction), and the line A3-A3 (source/drain formation regions), respectively, in FIG. 9(a), and FIGS. 10(d), 10(e), and 10(f) are cross-sectional views taken along the line B1-B1 (the gate length direction), the line B2-B2 (the gate width direction), and the line B3-B3 (source/drain formation regions), respectively, in FIG. 9(b). FIGS. 11(a), 11(b), 11(c), and 11(d) are cross-sectional views taken along the line C1-C1 (the gate length direction), the line C2-C2 (the gate width direction), the line C3-C3 (source/drain formation regions), and the line C4-C4 (extension formation regions), respectively, in FIG. 9(c), and FIGS. 11(e), 11(f), 11(g), and 11(h) are cross-sectional views taken along the line D1-D1 (the gate length direction), the line D2-D2 (the gate width direction), the line D3-D3 (source/drain formation regions), and the line D4-D4 (extension formation regions), respectively, in FIG. 9(d).

Figure 9:
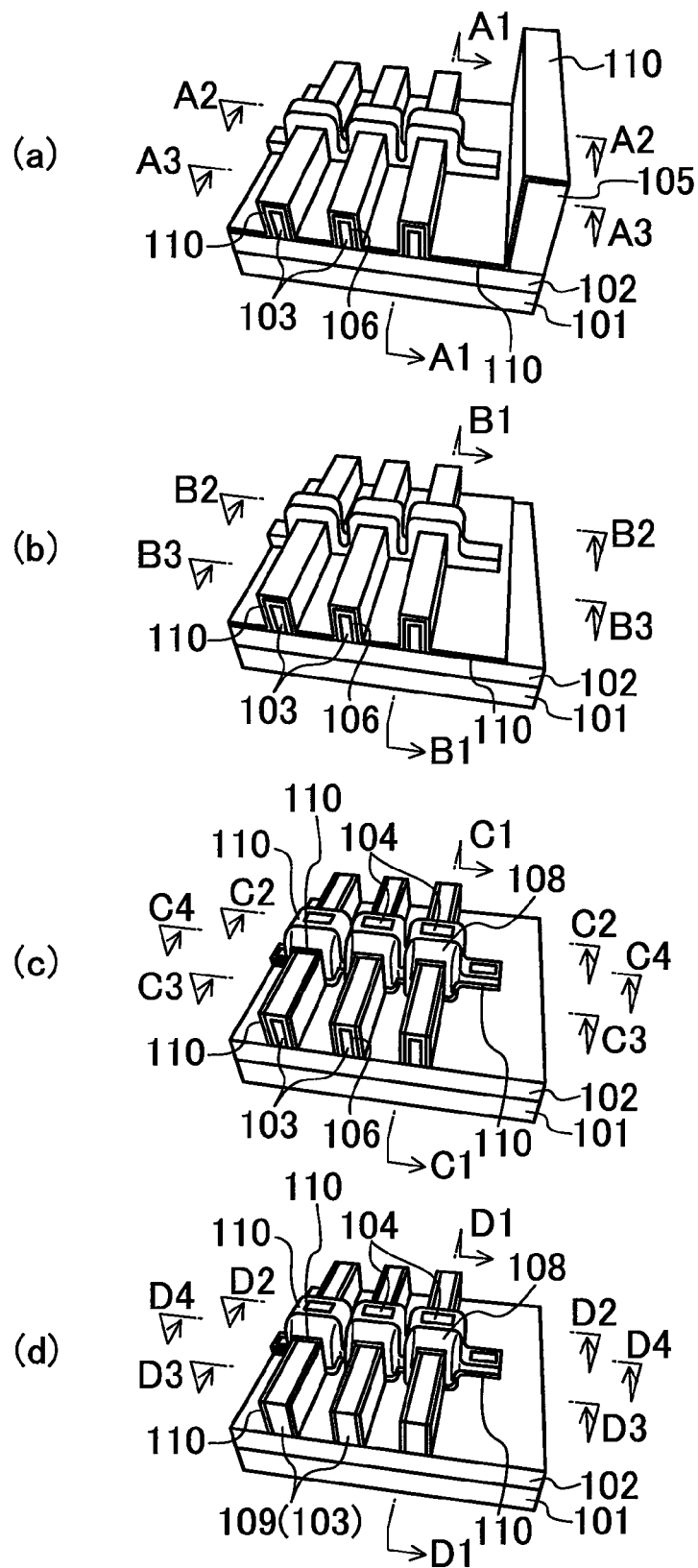
FIGS. 9(a)-9(d) are perspective views illustrating process steps in a method for fabricating a semiconductor device according to a second embodiment of the present invention.
Figure 10:
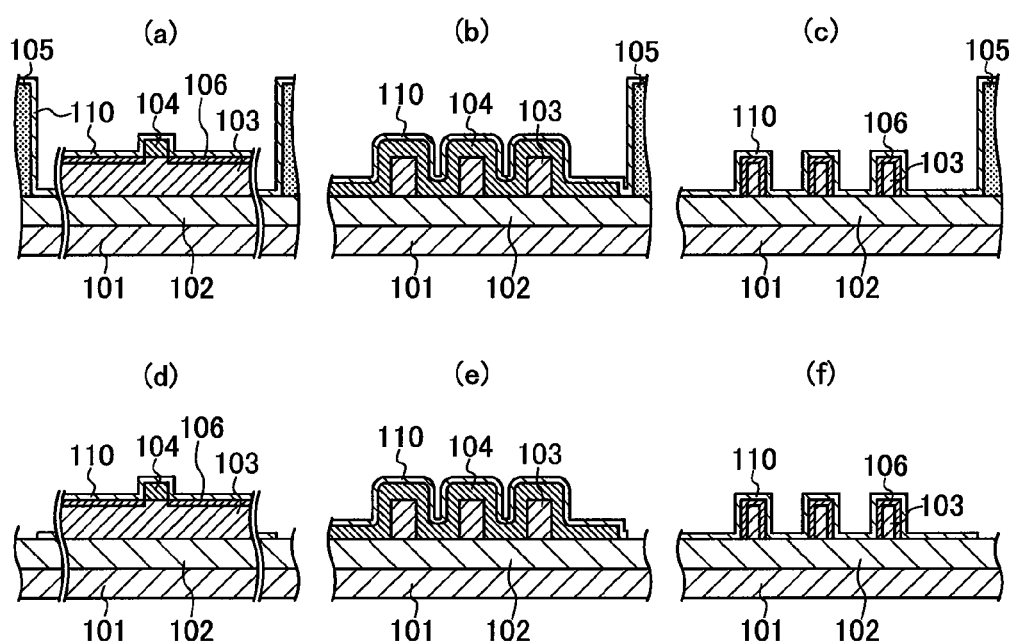
FIGS. 10(a), 10(b), and 10(c) are cross-sectional views taken along the line A1-A1 (the gate length direction), the line A2-A2 (the gate width direction), and the line A3-A3 (source/drain formation regions), respectively, in FIG. 9(a), and FIGS. 10(d), 10(e), and 10(f) are cross-sectional views taken along the line B1-B1 (the gate length direction), the line B2-B2 (the gate width direction), and the line B3-B3 (source/drain formation regions), respectively, in FIG. 9(b).

FIGS. 10(a), 10(d), 11(a), and 11(e) each illustrate a cross-sectional structure of a region which is wider than the region illustrated by the perspective view in FIGS. 9(a)-9(d), and FIGS. 11(d) and 11(h) each illustrate a cross-sectional structure of a portion of the region illustrated by the perspective view in FIGS. 9(c) and 9(d).

In the fabrication method for a semiconductor device according to this embodiment, first, similarly to the first embodiment, the process step illustrated in FIGS. 3(a) and 5(a)-5(c) (the process step of forming fin-type semiconductor regions 103 and a gate electrode 104), the process step illustrated in FIGS. 3(b) and 5(d)-5(f) (the process step of forming a resist pattern 105), and the process step illustrated in FIGS. 3(c) and 6(a)-6(c) (the process step of forming extension regions 106) are sequentially performed.

Specifically, as illustrated in FIGS. 3(a) and 5(a)-5(c), an SOI substrate including a silicon substrate 101 on which a BOX oxide film 102 and a silicon layer are sequentially stacked is first prepared, and then the silicon layer is patterned, thereby forming a plurality of fin-type semiconductor regions 103 on the silicon substrate 101 with the BOX oxide film 102 interposed therebetween. Next, a gate electrode 104 is formed astride predetermined portions (channel regions) of the fin-type semiconductor regions 103 in the gate width direction. Here, the width (width in the gate width direction: Wfin) of each of the fin-type semiconductor regions 103 is, for example, 10 nm, the height (Hfin) thereof is, for example, 60 nm, the interval (S) between each adjacent pair of the fin-type semiconductor regions 103 is 10 nm, and the width (width in the gate length direction: Wg) of the gate electrode 104 is 20 nm.

Next, as illustrated in FIGS. 3(b) and 5(d)-5(f), a resist pattern 105 is formed on the substrate to have an opening on a desired region into which impurities are to be implanted. Here, the height of the resist pattern 105 is set at, e.g., approximately 200 nm.

Next, as illustrated in FIGS. 3(c) and 6(a)-6(c), the entire substrate surface is exposed to a plasma containing boron by plasma doping using the resist pattern 105 and the gate electrode 104 as masks, and thus, boron is adhered to or implanted into the top and side surfaces of the fin-type semiconductor regions 103. This enables the formation of extension regions 106 in upper and side portions of the fin-type semiconductor regions 103 outside the gate electrode 104. Here, also in this embodiment, similarly to the first embodiment, how boron enters the inside of semiconductor from the top surfaces of the fin-type semiconductor regions 103 is significantly different from how boron enters the inside of semiconductor from the side surfaces thereof. Specifically, while there exists a relatively large amount of boron implanted from the top surfaces of the fin-type semiconductor regions 103 into semiconductor, the amount of boron implanted from the side surfaces of the fin-type semiconductor regions 103 into semiconductor is extremely small, such as less than 10% of the amount of boron implanted from the top surfaces thereinto, and there exists a large amount of boron merely adhered to the side surfaces of the fin-type semiconductor regions 103.

Next, in this embodiment, as illustrated in FIGS. 9(a) and 10(a)-10(c), the entire substrate surface is covered with a porous protective film 110. Here, in order to prevent curing of the resist pattern 105, the protective film 110 is preferably deposited at a low temperature of less than or equal to 100° C. Specifically, the protective film 110 made of a silicon oxide film, a silicon oxynitride film, etc., is deposited, e.g., by sputtering, electron cyclotron resonance plasma CVD, or physical vapor deposition.

The case where the protective film 110 is formed by one of physical vapor deposition techniques, vacuum deposition, will be exemplified hereinafter in detail. An evaporation source and a target substrate are first placed in a vacuum chamber having a pressure of approximately $10^{-2}$-$10^{-4}$ Pa. Thereafter, a thin film formation material is evaporated by applying heat to the evaporation source, and the material is adhered to the target substrate, thereby forming a protective film 110. In this case, the mean free path of the thin film formation material is approximately tens of centimeters to tens of meters, and thus, particles of the thin film formation material evaporated from the evaporation source hardly collide with one another, and reach the target substrate. Here, since the energy of the evaporated particles is low, such as approximately 0.1-1 eV, vacuum deposition causes minor damage to the target substrate, and is less likely to cause the film to contain an impure material (an unintended contaminant) while tending to cause the film to be porous. Therefore, in this embodiment, the porous protective film 110 may be formed by, e.g., this vacuum deposition.

In this embodiment, the thickness of the protective film 110 can be optionally set within the range of, e.g., approximately 0.5-10 nm, depending on the interval (S) between each adjacent pair of the fin-type semiconductor regions 103. However, when the interval (S) is, for example, 10 nm, the thickness of the protective film 110 can be set at, e.g., 3 nm to prevent the spaces between the adjacent fin-type semiconductor regions 103 from being filled with the protective film 110. The protective film 110 covers not only the side surfaces of the fin-type semiconductor regions 103 but also the top surfaces of the fin-type semiconductor regions 103 and the top and side surfaces of the resist pattern 105.

Next, the entire substrate surface is brought into contact with a chemical solution, e.g., a cleaning fluid, such as SPM or APM, thereby removing the resist pattern 105 as illustrated in FIGS. 9(b) and 10(d)-10(f). When a metal material, such as tungsten (W) or tantalum (Ta), is used as a material of the gate electrode 104, the use of a cleaning fluid containing an oxidizer ($H_2O_2$) causes oxidative dissolution of such metals. Therefore, a cleaning fluid which does not contain an oxidizer ($H_2O_2$) is preferably used to prevent dissolution of such metals. Furthermore, the resist pattern 105 is in contact with the cleaning fluid flowing through the porous protective film 110 and thus dissolved in the cleaning fluid so as to be stripped off, and simultaneously, a portion of the protective film 110 covering the top and side surfaces of the resist pattern 105 are also removed together with the resist pattern 105. Since the top and side surfaces of the fin-type semiconductor regions 103 and boron adhered to the top and side surfaces thereof in the plasma doping process step illustrated in FIGS. 3(c) and 6(a)-6(c) are covered with the protective film 110, the boron is maintained between the top and side surfaces of the fin-type semiconductor regions 103 and the protective film 110 without being removed even during the above-described cleaning.

Figure 11:
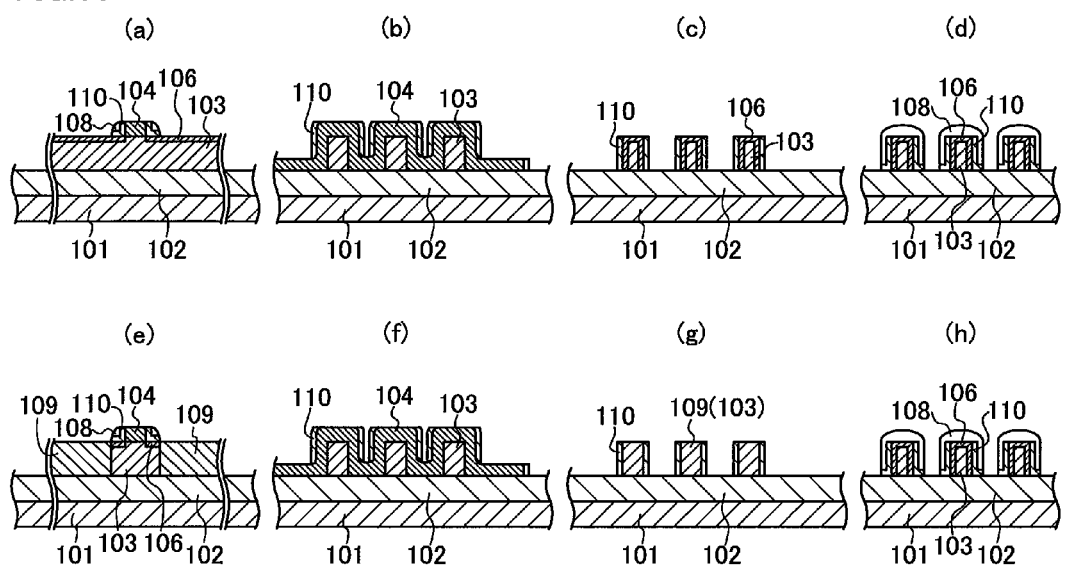
FIGS. 11(a), 11(b), 11(c), and 11(d) are cross-sectional views taken along the line C1-C1 (the gate length direction), the line C2-C2 (the gate width direction), the line C3-C3 (source/drain formation regions), and the line C4-C4 (extension formation regions), respectively, in FIG. 9(c), and FIGS. 11(e), 11(f), 11(g), and 11(h) are cross-sectional views taken along the line D1-D1 (the gate length direction), the line D2-D2 (the gate width direction), the line D3-D3 (source/drain formation regions), and the line D4-D4 (extension formation regions), respectively, in FIG. 9(d).

Next, as illustrated in FIGS. 9(c) and 11(a)-11(d), insulative sidewall spacers 108 are formed on the side surfaces of the gate electrode 104 with the protective film 110 interposed therebetween. Thus, the extension regions 106 are protected by the insulative sidewall spacers 108. Portions of the protective film 110 located on the top surfaces of regions of the fin-type semiconductor regions 103 which are not covered with the insulative sidewall spacers 108 and portions of the protective film 110 located on the top surface of the gate electrode 104 and the top surface of the BOX oxide film 102 are removed in the formation of the insulative sidewall spacers 108. In other words, portions of the protective film 110 located on the top surfaces of regions of the fin-type semiconductor regions 103 which are covered with the insulative sidewall spacers 108 and portions of the protective film 110 located on the side surfaces of the fin-type semiconductor regions 103 and the side surfaces of the gate electrode 104 remain. Therefore, as illustrated in FIG. 11(d), the protective film 110 is interposed between portions of the extension regions 106 located in upper and side portions of regions of the fin-type semiconductor regions 103 adjacent to the gate electrode 104, and the insulative sidewall spacers 108. Furthermore, as illustrated in FIG. 11(a), the protective film 110 is also interposed between portions of the extension regions 106 located in the upper portions of regions of the fin-type semiconductor regions 103 adjacent to the gate electrode 104, and the insulative sidewall spacers 108.

Next, impurities, such as boron, are relatively deeply implanted into the fin-type semiconductor regions 103 using the gate electrode 104 and the insulative sidewall spacers 108 as masks, thereby forming source/drain regions 109 as illustrated in FIGS. 9(d) and 11(e)-11(f). In this case, a protective film 110 may be formed on the side surfaces of the fin-type semiconductor regions 103 serving as the source/drain regions 109. Alternatively, insulative sidewall spacers 108 may be formed on the side surfaces of the fin-type semiconductor regions 103 serving as the source/drain regions 109 with the protective film 110 interposed therebetween.

Thereafter, activation annealing is performed to electrically activate boron in the extension regions 106 and the source/drain regions 109. In this case, boron adhered to the surfaces of the extension regions 106 formed in upper and side portions of the fin-type semiconductor regions 103 in the plasma doping process step illustrated in FIGS. 3(c) and 6(a)-6(c) is sufficiently maintained without being removed during the above-described cleaning. Therefore, since activation annealing enables electrical activation of a large amount of boron, this can reduce the resistance of extension regions 106 formed in upper and side portions of the fin-type semiconductor regions 103.

A principal portion of the fin-type FET of this embodiment is completed through the above-described process steps.

According to the second embodiment, before the resist pattern 105 used as a mask for impurity implantation using plasma doping is removed by cleaning, the side surfaces of the fin-type semiconductor regions 103 into or to which impurities are implanted or adhered are covered with the protective film 110. This can prevent a situation where the impurities, e.g., adhered to the side surfaces of the fin-type semiconductor regions 103 by plasma doping is removed during cleaning. Therefore, ultra-shallow extension regions 106 providing low resistance can be formed in side portions of the fin-type semiconductor regions 103 by impurity implantation using plasma doping, thereby providing desired characteristics of the fin-type FET.

According to the second embodiment, since a porous film is formed as the protective film 110, the following advantage can be provided. Specifically, although the protective film 110 covers not only the extension regions 106 of the fin-type semiconductor regions 103 but also the resist pattern 105, the formation of the porous protective film 110 allows a chemical solution (cleaning fluid) to flow through the protective film 110 in the cleaning process step, and thus, the cleaning fluid can reach the resist pattern 105. This enables reliable removal of the resist pattern 105 in the cleaning process step. On the other hand, the cleaning fluid reaches also the extension regions 106 of the fin-type semiconductor regions 103, and thus, while the impurities in portions, which are in contact with pores (micropores) of the protective film 110, of the surfaces of the extension regions 106 may be removed, the impurities in portions, which are in direct contact with a body portion of the protective film 110, of the surfaces of the extension regions 106 are not removed. Here, if the proportion of the volume of the pores of the protective film 110 to the volume of the entire protective film 110 is approximately one half, the formation of such a protective film 110 can reduce the proportion (which is 1 when no protective film 110 is formed) of the surface area of portions of the extension regions 106 being in contact with the cleaning fluid to the entire surface area of the extension regions 106 to approximately 0.5. Therefore, in this case, when the protective film 110 is formed, the loss of the impurities in the cleaning process step can be reduced to approximately half of the loss of the impurities caused when no protective film 110 is formed.

Furthermore, according to the second embodiment, since the protective film 110 is formed at a low temperature of less than or equal to 100° C., this can prevent a situation where the resist pattern 105 is cured during the formation of the protective film 110, thereby facilitating removing the resist pattern 105 in the cleaning process step.

In the second embodiment, the protective film 110 may contain the same element as an impurity for forming the extension regions 106. For example, when an implanted impurity is boron (B), a BSG film may be formed as the protective film 110. This can reduce the amount of the impurities diffused from the extension regions 106 into the protective film 110 due to the difference in impurity concentration between the extension regions 106 and the protective film 110 in an impurity activation annealing process step. Therefore, a large amount of the impurities remaining in the extension regions 106 during the impurity activation annealing, i.e., a large amount of the impurities electrically activated by activation annealing to contribute to a resistance reduction, can be maintained.

In the second embodiment, the thickness of the protective film 110 is preferably greater than or equal to 0.5 nm and less than or equal to 10 nm. The reason for this is that when the thickness of the protective film 110 is less than 0.5 nm, the protective film 110 is so thin that it is difficult to reduce the loss of the impurities during cleaning, and when the thickness of the protective film 110 is greater than 10 nm, the protective film 110 is so thick that it is difficult to remove the protective film 110.

In the second embodiment, after the process step of forming extension regions 106 (plasma doping process step), a protective film 110 may be formed without exposure to the atmosphere. For example, the process step of forming extension regions 106 and the process step of forming a protective film 110 may be successively performed in the same chamber. This can prevent the impurities adhered to or implanted into the surfaces of the fin-type semiconductor regions 103 in the process step of forming the extension regions 106 from being oxidized between the process step of forming the extension regions 106 and the process step of forming the protective film 110.

In the second embodiment, ashing may be performed before the resist pattern 105 is removed by chemical cleaning. Alternatively, rinsing using water may be performed after the resist pattern 105 is removed by chemical cleaning.

In the second embodiment, p-type extension regions 106 and source/drain regions 109, i.e., a p-type FET, is formed using, e.g., boron as a p-type impurity. However, alternatively, n-type extension regions 106 and source/drain regions 109, i.e., an n-type FET, may be formed using, e.g., phosphorus as an n-type impurity.

Industrial Applicability

The present invention relates to semiconductor devices and methods for fabricating the same, and is useful, in particular, to provide a semiconductor device of a three-dimensional structure including fin-type semiconductor regions on a substrate, and exhibiting desired characteristics.

Description of Reference Characters
101 Silicon Substrate
102 BOX Oxide Film
103 Fin-Type Semiconductor Region
104 Gate Electrode
105 Resist Pattern
106 Extension Region
107, 110 Protective Film
108 Insulative Sidewall Spacer
109 Source/Drain Region

The invention claimed is:

1. A method for fabricating a semiconductor device, the method comprising steps of:
   (a) forming a fin-type semiconductor region on a substrate;
   (b) after the step (a), forming a resist pattern on the substrate;
   (c) implanting an impurity into the fin-type semiconductor region by a plasma doping process using the resist pattern as a mask;
   (d) after the step (c), covering at least a side of the fin-type semiconductor region with a protective film;
   (e) after the step (d), removing the resist pattern by cleaning with a chemical solution; and
   (f) after the step (e), activating the impurity implanted into the fin-type semiconductor region by heat treatment.

2. The method of claim 1, wherein
in the step (d), the protective film also covers a top surface of the resist pattern, and
the method further includes, between the steps (d) and (e), at least partially removing a portion of the protective film located on the top surface of the resist pattern.

3. The method of claim 1, wherein
in the step (d), a porous film is formed as the protective film.

4. The method of claim 1, wherein
in the step (d), the protective film is formed at a temperature of equal to or less than 100° C.

5. The method of claim 1, wherein
the protective film contains a same element as the impurity.

6. The method of claim 1, wherein
a thickness of the protective film is greater than or equal to 0.5 nm and less than or equal to 10 nm.

7. The method of claim 1, wherein
after the step (c), the step (d) is performed without exposure to atmosphere.

8. The method of claim 7, wherein
the steps (c) and (d) are successively performed in a same chamber.

9. The method of claim 1 further comprising
between the steps (a) and (b), forming a gate electrode astride the fin-type semiconductor region,
wherein in the step (d), the protective film is formed on at least a side of the gate electrode, and
the method further includes, after the step (e), forming an insulative sidewall spacer on the side of the gate electrode with the protective film interposed between the sidewall spacer and the gate electrode.

* * * * *